United States Patent [19]
Gilley et al.

[11] Patent Number: 6,003,319
[45] Date of Patent: Dec. 21, 1999

[54] THERMOELECTRIC REFRIGERATOR WITH EVAPORATING/CONDENSING HEAT EXCHANGER

[75] Inventors: Michael D. Gilley, Rowlett, Tex.; Ralph L. Webb, Port Matilda, Pa.

[73] Assignee: Marlow Industries, Inc., Dallas, Tex.

[21] Appl. No.: 09/058,269

[22] Filed: Apr. 10, 1998

Related U.S. Application Data

[63] Continuation-in-part of application No. 08/544,169, Oct. 17, 1995, Pat. No. 5,737,923.

[51] Int. Cl.$^6$ .................................................. F25B 21/02
[52] U.S. Cl. ............................... 62/3.7; 62/3.6; 62/3.64; 62/430; 165/104.21
[58] Field of Search ..................... 62/3.6, 3.7, 3.64, 62/430; 165/104.21

[56] References Cited

U.S. PATENT DOCUMENTS

| | | | |
|---|---|---|---|
| 2,083,611 | 6/1937 | Marshall | 165/104.21 |
| 2,837,899 | 6/1958 | Lindenblad | 62/1 |
| 2,947,150 | 8/1960 | Roeder, Jr. | 62/3.6 |
| 3,149,471 | 9/1964 | Boehmer et al. | 62/3 |
| 3,149,666 | 9/1964 | Coe | 165/121 |
| 3,177,670 | 4/1965 | Boehmer et al. | 62/3 |
| 3,205,667 | 9/1965 | Frantti | 62/3 |
| 3,280,573 | 10/1966 | Brown et al. | 62/3 |
| 3,821,881 | 7/1974 | Harkias | 62/3.6 |
| 3,823,567 | 7/1974 | Corini | 62/3 |
| 3,852,805 | 12/1974 | Brzozowski | 357/82 |
| 3,990,862 | 11/1976 | Dahl et al. | 29/191.2 |
| 4,004,441 | 1/1977 | Leszak | 72/75 |
| 4,007,600 | 2/1977 | Simms | 62/3 |
| 4,093,755 | 6/1978 | Dahl et al. | 165/104.21 |
| 4,312,012 | 1/1982 | Frieser et al. | 357/82 |
| 4,326,383 | 4/1982 | Reed et al. | 62/3 |
| 4,353,415 | 10/1982 | Klaschka et al. | 165/104.21 |
| 4,472,945 | 9/1984 | Cech et al. | 62/3 |
| 4,586,342 | 5/1986 | Morishita et al. | 62/3.6 |

(List continued on next page.)

FOREIGN PATENT DOCUMENTS

| | | | |
|---|---|---|---|
| 0 242 669 A1 | 4/1987 | European Pat. Off. | F28D 15/02 |
| 0 645 593 A1 | 9/1994 | European Pat. Off. | F25B 21/02 |
| 0140253 | 10/1979 | Japan | 165/141 |
| 0046331 | 4/1980 | Japan | 165/104 |
| 0068588 | 5/1980 | Japan | 165/104 |
| 0095595 | 6/1982 | Japan | 165/151 |
| 0173082 | 8/1986 | Japan | 165/104 |
| 0078897 | 3/1990 | Japan | 165/104 |
| 406077677 | 3/1994 | Japan | 361/697 |
| WO 89/06335 | 7/1989 | WIPO | F25B 21/02 |
| WO 94/20801 | 9/1994 | WIPO | F25B 21/02 |

OTHER PUBLICATIONS

U.S. Patent Application Ser. No. 08/416,450, filed Apr. 3, 1995 entitled "Integrated Thermoelectric Device and Heat Exchanger".

U.S. Patent Application Ser. No. 08/201,619, filed Feb. 25, 1994 (now abandoned) entitled "Integrated Thermoelectric Device and Heat Exchanger".

R. Webb, *Principles of Enhanced Heat Transfer*, Chapter 11 (1992).

*Primary Examiner*—Henry Bennett
*Assistant Examiner*—Mark Shulman
*Attorney, Agent, or Firm*—Baker & Botts, L.L.P.

[57] ABSTRACT

A thermoelectric refrigerator with a heat transfer system having a thermoelectric device and a heat exchanger with an evaporating surface and a condensing surface. A working fluid is sealed within the heat exchanger. The thermoelectric device includes a thermally conductive hot plate and a thermally conductive cold plate with thermoelectric elements disposed therebetween. The thermoelectric elements are preferably electrically coupled in series and thermally coupled in parallel. The evaporating surface of the heat exchanger is thermally coupled with the hot plate. A fluid flow path is provided to allow working fluid in its vapor phase to flow from the evaporating surface to the condensing surface and working fluid in its liquid phase to flow from the condensing surface to the evaporating surface. The configuration of the heat exchanger will optimize heat transfer by the working fluid from the thermoelectric device.

22 Claims, 5 Drawing Sheets

U.S. PATENT DOCUMENTS

| | | | |
|---|---|---|---|
| 4,726,193 | 2/1988 | Burke et al. | 62/3 |
| 4,744,220 | 5/1988 | Kerner et al. | 62/3 |
| 4,787,442 | 11/1988 | Esformes | 165/181 |
| 4,829,771 | 5/1989 | Koslow et al. | 62/3.64 |
| 4,833,567 | 5/1989 | Saaski et al. | 361/385 |
| 4,833,888 | 5/1989 | Kerner et al. | 62/3.3 |
| 4,855,810 | 8/1989 | Gelb et al. | 357/87 |
| 4,966,226 | 10/1990 | Hamburgen | 165/104.26 |
| 4,982,274 | 1/1991 | Murase et al. | 357/82 |
| 4,989,626 | 2/1991 | Takagi et al. | 137/13 |
| 4,995,451 | 2/1991 | Hamburgen | 165/104.33 |
| 5,056,594 | 10/1991 | Kraay | 165/151 |
| 5,064,476 | 11/1991 | Recine, Sr. | 136/201 |
| 5,090,981 | 2/1992 | Rusek, Jr. | 65/4.4 |
| 5,094,899 | 3/1992 | Rusek, Jr. | 428/69 |
| 5,154,661 | 10/1992 | Higgins | 62/3.3 |
| 5,168,339 | 12/1992 | Yokotani et al. | 257/64 |
| 5,168,919 | 12/1992 | Berenholz et al. | 165/80.4 |
| 5,206,791 | 4/1993 | Novotny | 361/385 |
| 5,209,069 | 5/1993 | Newman | 62/3.64 |
| 5,213,153 | 5/1993 | Itoh | 165/104 |
| 5,216,580 | 6/1993 | Davidson et al. | 361/385 |
| 5,253,702 | 10/1993 | Davidson et al. | 165/80.4 |
| 5,308,920 | 5/1994 | Itoh | 174/15.2 |
| 5,330,816 | 7/1994 | Rusek, Jr. | 428/69 |
| 5,343,940 | 9/1994 | Jean | 165/104.33 |
| 5,353,863 | 10/1994 | Yu | 165/80.3 |
| 5,367,890 | 11/1994 | Doke | 62/3.7 |
| 5,458,189 | 10/1995 | Larson et al. | 165/104 |
| 5,465,782 | 11/1995 | Sun et al. | 165/104 |
| 5,522,216 | 6/1996 | Park et al. | 62/3.6 |
| 5,605,047 | 2/1997 | Park et al. | 62/3.6 |
| 5,613,552 | 3/1997 | Osakabe et al. | 165/104 |
| 5,638,896 | 6/1997 | Nishino et al. | 165/132 |
| 5,653,111 | 8/1997 | Atty et al. | 62/3.7 |
| 5,737,923 | 4/1998 | Gilley et al. | 62/3.7 |
| 5,845,497 | 12/1998 | Watanabe et al. | 62/3.6 |

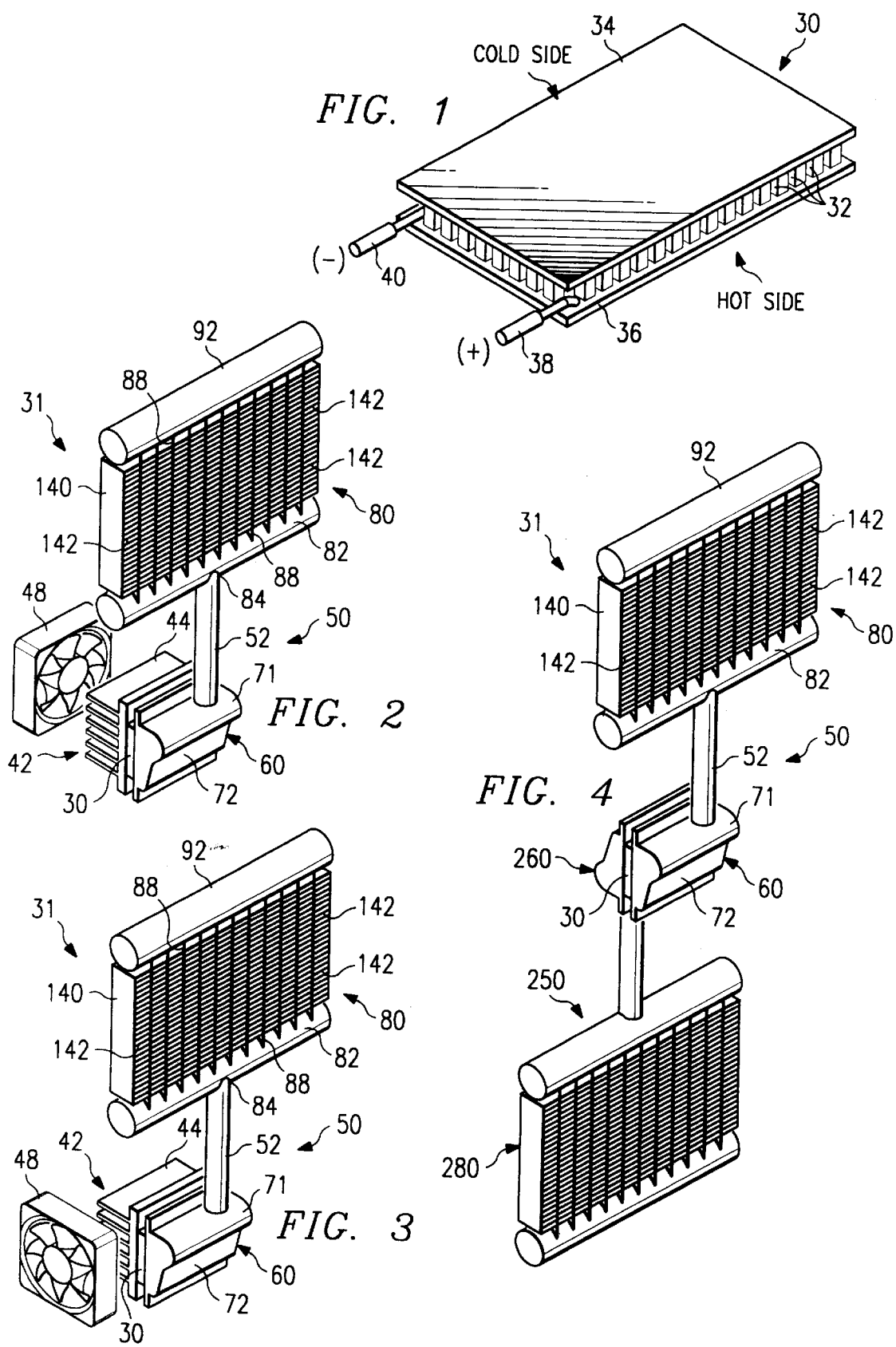

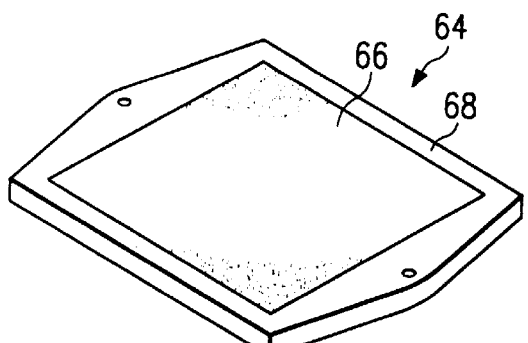
FIG. 7
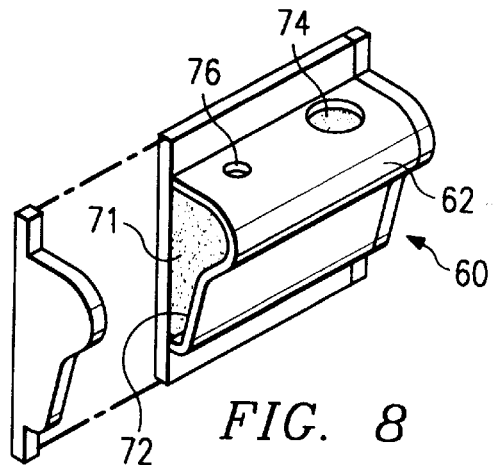
FIG. 8
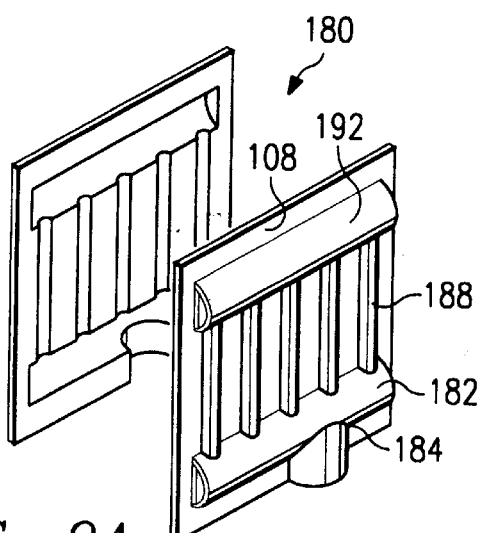
FIG. 9A
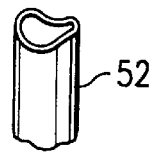
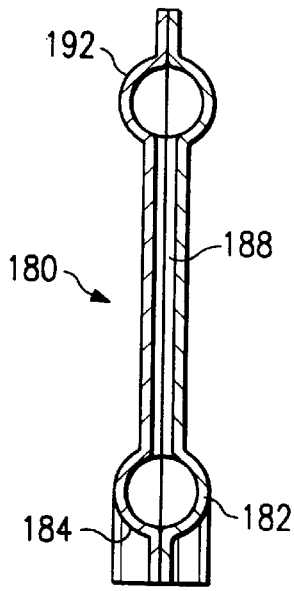
FIG. 9B

THERMOELECTRIC REFRIGERATOR WITH EVAPORATING/CONDENSING HEAT EXCHANGER

RELATED APPLICATION

This application is a continuation-in-part application of patent application entitled Thermoelectric Device with Evaporating/Condensing Heat Exchanger, Ser. No. 08/544, 169 filed Oct. 17, 1995, now U.S. Pat. No. 5,737,923 dated Apr. 14, 1998.

This application is also related to patent application entitled Thermoelectric Device with Evaporating/Condensing Heat Exchanger, Ser. No. 09/022,728 filed Feb. 12, 1998, which is a continuation of patent application entitled Thermoelectric Device with Evaporating/Condensing Heat Exchanger, Ser. No. 08/544,169 filed Oct. 17, 1995, now U.S. Pat. No. 5,737,923 dated Apr. 14, 1998.

TECHNICAL FIELD OF THE INVENTION

This invention relates in general to thermoelectric refrigerators, and more particularly to a refrigerator having a thermoelectric device coupled with a heat exchanger having an evaporating section and a condensing section.

BACKGROUND OF THE INVENTION

The basic theory and operation of thermoelectric devices have been developed for many years. Thermoelectric devices are essentially small heat pumps which follow the laws of thermodynamics in the same manner as mechanical heat pumps, vapor compressors associated with conventional refrigerators, or other apparatus used to transfer energy. A thermoelectric device can function as a cooler, heater, power generator or thermal energy sensor.

Modern thermoelectric devices typically have solid state electrical components as compared to more traditional mechanical/fluid heating and cooling components. The circuit for a modern thermoelectric device generally includes two dissimilar materials such as N-type and P-type thermoelectric semiconductor elements typically arranged in an alternating N-element and P-element configuration. The thermoelectric elements are generally coupled electrically in series and thermally in parallel. The Peltier effect occurs when voltage is applied to the N-type and the P-type elements resulting in current flow through the serial electrical coupling. The serial current flow results in heat transfer across the N-type and P-type elements in the parallel thermal coupling. The direction of current flow through the thermoelectric elements determines the direction of heat transfer by the thermoelectric elements.

The efficiency of a thermoelectric device typically decreases with an increase in the difference in temperature across the associated thermoelectric elements. To achieve a minimal temperature difference across the thermoelectric elements, a first heat-sink (sometimes referred to as the "hot sink") is preferably coupled to the hot side of the thermoelectric device to aid in dissipating heat from the thermoelectric elements to the adjacent environment. In a similar manner, a second heat sink (sometimes referred to as a "cold sink") is often coupled to the cold side of the thermoelectric device to aid in removing heat from the adjacent environment. Increased cooling of the first heat sink or hot sink further increases the efficiency of the associated thermoelectric device. Natural convection, forced convection, liquid cooling or a combination thereof are currently practiced methods for cooling the hot sink.

For some applications natural convection cooling of a heat sink may not dissipate sufficient heat energy to allow the associated thermoelectric device to operate efficiently. Forced convection cooling enhances natural convection cooling by forcing air flow across the heat transfer surfaces of the heat sink thereby increasing the heat dissipating capability of the heat sink. Unfortunately, forced convection cooling systems require additional hardware and circuitry to control the fans, motors and power convertors along with fittings necessary for forced convection cooling. These additional components add to the complexity of the associated thermoelectric heat transfer system.

Liquid cooling of a heat sink to increase energy dissipation from the heat sink is also currently practiced and involves providing liquid coolant flow through or around the associated heat sink. Unfortunately, such liquid cooling also requires additional hardware and fittings to provide the desired liquid coolant flow.

Boiling a liquid on a surface of a heat sink is another technique to increase energy dissipation from the heat sink. From the perspective of enhanced thermodynamic efficiency associated with boiling a liquid such as a refrigerant, it is often desirable to have vaporization of the liquid take place with very little, if any, superheating of the bulk liquid. Open cell porous coatings have previously been used on some heat exchanger elements to provide an enhanced heat transfer surface which will thermodynamically affect boiling of the liquid. The porous coating on the enhanced heat transfer surface provides a multitude of interconnected open cells which are partially filled with liquid and act as nucleation sites for the growth of vapor bubbles within the boiling liquid. U.S. Pat. No. 3,990,862 entitled "Liquid Heat Exchanger Interface and Method" provides examples of such enhanced heat transfer surfaces.

Various enhanced heat transfer surfaces have previously been used to improve the thermodynamic efficiency with respect to condensing vapors on the associated surfaces. Enhanced heat transfer surfaces have also been used to improve the thermodynamic efficiency of both natural and forced convection cooling of the associated surfaces.

A wide variety of containers and enclosed structures are designed to be maintained within a selected temperature range. Examples of such containers and enclosed structures include, but are not limited to, refrigerators, picnic coolers, cabinets containing sensitive electronic equipment, and organ transplant containers. The use of thermoelectric devices which operate on a DC voltage system is well known to maintain desired operating temperatures in refrigerators, portable coolers, and other types of enclosed structures. An example of a container having a thermoelectric cooler is shown in U.S. Pat. No. 4,726,193 entitled Temperature Controlled Picnic Box. Examples of refrigerators which function with a thermoelectric device are shown in U.S. Pat. No. 2,837,899 entitled Thermoelectric Refrigerator; U.S. Pat. No. 3,177,670 entitled Thermoelectric Refrigerator; and U.S. Pat. No. 3,280,573 entitled Refrigerator—Package Arrangement. U.S. Pat. No. 5,168,339, entitled Thermoelectric Semiconductor Having a Porous Structure Deaerated in a Vacuum and Thermoelectric Panel Using P-Type and N-Type Thermoelectric Semiconductors discloses an electronic refrigerator panel. A more recent example of a thermoelectric refrigerator is shown in U.S. Pat. No. 5,522,216 entitled Thermoelectric Refrigerator.

Conventional refrigerators typically consist of an insulated enclosure with a cooling system based on the vapor compression cycle of fluorinated hydrocarbons, chlorofluorohydrocarbons, or other types of hydrocarbons. The cooling system associated with conventional refrigerators usually has greater cooling capacity than the actual heat load which results in the cooling system acting intermittently in a binary duty cycle—either on or off. This binary duty cycle results in temperature variations as the refrigerator warms up while the compressor is off and cools down when the compressor is running. Thus the temperature in a typical refrigerator is not steady, but cycles between an upper limit and a lower limit. This compressor cycling may reduce the operating efficiency of the associated cooling system.

The negative effects of refrigerants associated with conventional refrigerators on the environment are well known. Both national and international regulations exist to ban the use of some refrigerants such as CFCs. Other fluorocarbons such as HCFCs and HFCs have their own limitations and problems for use in refrigeration systems.

SUMMARY OF THE INVENTION

In accordance with teachings of the present invention, a thermoelectric refrigerator having a thermoelectric heat transfer system with a thermoelectric device and at least one heat exchanger are provided to substantially eliminate or reduce disadvantages and problems associated with previous thermoelectric refrigerators and thermoelectric heat transfer systems. The present invention provides an efficient, non-fluorocarbon heat transfer system for a thermoelectric refrigerator which includes a thermoelectric device coupled with at least one heat exchanger having an evaporating or boiling surface and a condensing surface with a working fluid sealed within the heat exchanger. For some applications, one or more enhanced heat transfer surfaces are incorporated as part of the heat exchanger. As a result, boiling and condensing of the working fluid can occur with a relatively low heat flux and improved thermodynamic efficiency.

A thermoelectric heat transfer system incorporating teachings of the present invention preferably includes first and second thermally conductive plates having multiple thermoelectric elements disposed therebetween. At least one of the thermally conductive plates is thermally coupled with a heat exchanger incorporating teachings of the present invention. The heat exchanger preferably includes a first chamber or boiling section and a second chamber or condensing section with one or more enhanced heat transfer surfaces formed as part of the respective boiling section and condensing section. A fluid communication flow path is provided between the condensing section and the boiling section to allow working fluid to flow between these two sections of the heat exchanger. The geometric configuration and dimensions associated with the first chamber and the second chamber can be varied in accordance with the teachings of the present invention to optimize performance of the associated thermoelectric device.

Technical advantages of a thermoelectric refrigerator incorporating teachings of the present invention include an environmentally benign heat transfer system that is energy efficient by reducing the operating temperature and/or the difference in temperature across thermoelectric elements and associated components to substantially increase both the heat transfer capability and resulting service life of the heat transfer system. A thermoelectric refrigerator incorporating the teachings of the present invention may increase heating and cooling efficiency for an associated thermoelectric device by providing an enhanced heat transfer surface to promote nucleate boiling of a selected working fluid with relatively low heat flux. Without the use of an enhanced heat transfer surface, a relatively high heat flux is generally required to achieve nucleate boiling of a working fluid on a conventional heat transfer surface. The use of enhanced heat transfer surfaces in accordance with the teachings of the present invention results in nucleate boiling with very low amounts of heat flux and little or no superheating of the associated working fluid.

Significant technical advantages of a thermoelectric refrigerator incorporating the present invention include lower power consumption resulting from overall improvements in the system operating efficiency. Since the cooling system includes a thermoelectric assembly, power spikes associated with the binary cycling of a typical fluorinated hydrocarbon vapor compressor have been eliminated.

Further technical advantages of the present invention include the use of working fluids which are environmentally friendly while at the same time substantially increasing the thermal efficiency of the associated thermoelectric device. Enhanced heat transfer surfaces may be provided as part of the boiling section, condensing section and/or convection cooler associated with the heat exchanger. The enhanced heat transfer surfaces may be fabricated by cold forming aluminum, copper or alloys of these metals as appropriate for the selected working fluid and designed heat transfer rate.

For one application, the heat exchanger preferably includes a first chamber for evaporating or boiling a working fluid. The first chamber preferably has a first portion with a relatively small volume and a second portion with a relatively large volume. The volume of the first portion is selected to increase contact between the working fluid in its liquid phase and an associated evaporating surface. The volume of the second portion is selected to accommodate fluid communication of a mixture of working fluid in its liquid phase and its vapor phase.

BRIEF DESCRIPTION OF THE DRAWINGS

For a more complete understanding of the present invention and the advantages thereof, reference is now made to the following written description taken in conjunction with the accompanying drawings, in which:

FIG. 1 is a schematic drawing showing an isometric view of a thermoelectric device satisfactory for use with the present invention;

FIG. 2 is an isometric drawing of a thermoelectric heat transfer system with a thermoelectric device and a heat exchanger incorporating one embodiment of the present invention;

FIG. 3 is an isometric drawing of a thermoelectric heat transfer system with a thermoelectric device and a heat exchanger incorporating another embodiment of the present invention;

FIG. 4 is an isometric drawing of a thermoelectric heat transfer system with a thermoelectric device and two heat exchangers incorporating another embodiment of the present invention;

FIG. 7 is an isometric drawing showing a portion of a boiling or evaporating section having an enhanced heat transfer surface satisfactory for use with the heat exchangers of FIGS. 2–5;

FIG. 8 is an isometric drawing with portions broken away showing another portion of a boiling or evaporating section satisfactory for use with the heat exchangers of FIGS. 2–5;

FIG. 9A is an isometric drawing with portions broken away showing an alternative embodiment of a condensing section satisfactory for use with the heat exchangers of FIGS. 2–5;

FIG. 9B is a schematic drawing in section illustrating the condensing section of FIG. 9A;

DETAILED DESCRIPTION OF THE INVENTION

Figure 5:
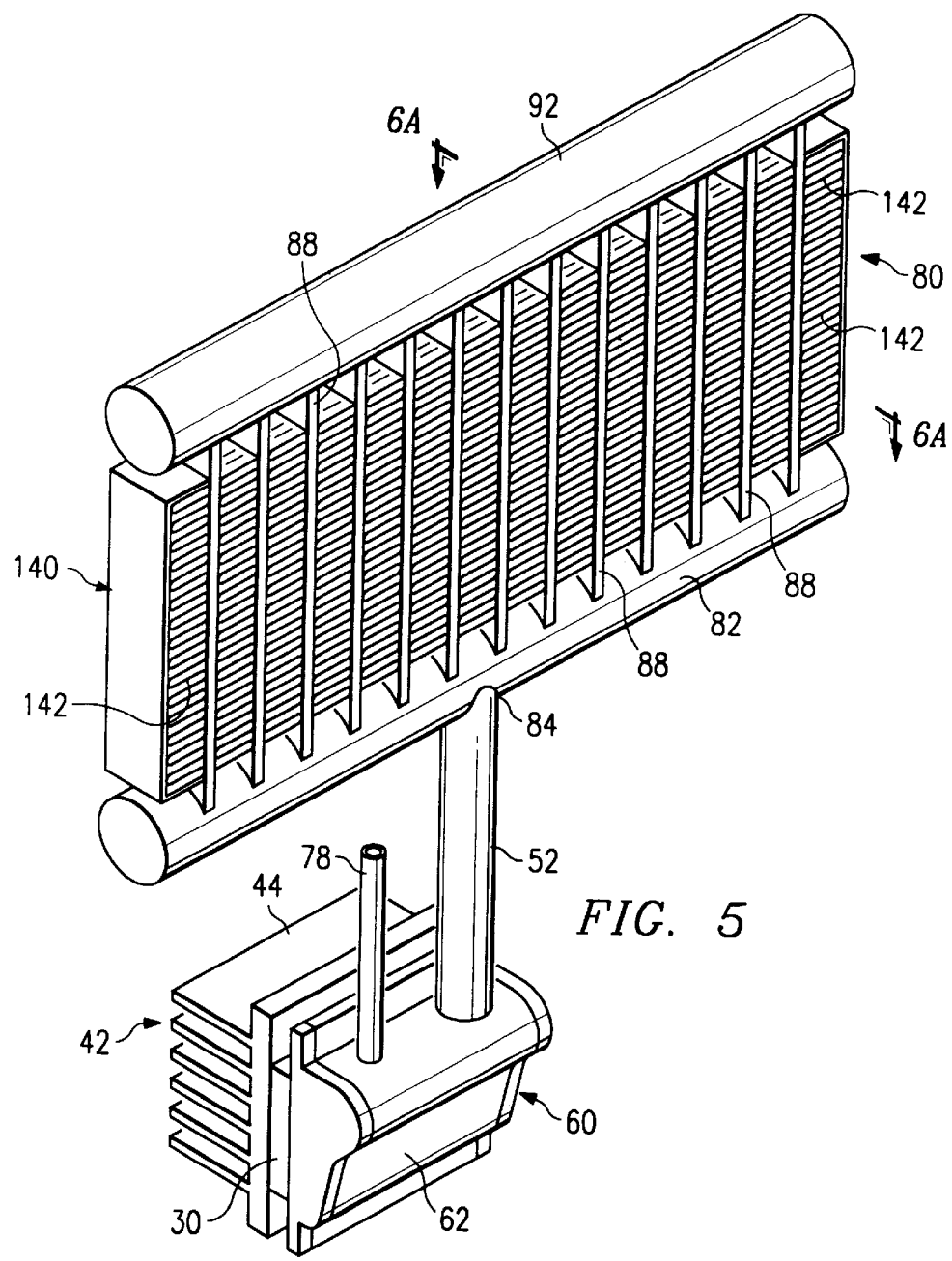
FIG. 5 is an enlarged isometric drawing showing portions of the heat transfer system of FIGS. 2 and 3.

The preferred embodiments of the present invention and its advantages are best understood by referring to FIGS. 1–12C of the drawings, like numerals being used for like and corresponding parts of the various drawings.

FIG. 1 shows thermoelectric device 30 including a plurality of thermoelectric elements 32 disposed between thermally conductive plates 34 and 36. Thermally conductive plates 34 and 36 may be formed from ceramic and/or composite materials as desired. Thermoelectric elements 32 may be formed from selected materials such as bismuth telluride to provide an array of P-N junctions with desired thermoelectric characteristics to allow thermoelectric device 30 to function as a heat pump. Appropriate bonding techniques such as soldering (not explicitly shown) may be used to electrically and thermally couple plates 34 and 36 to thermoelectric elements 32 disposed therebetween.

Thermoelectric devices (sometimes referred to as thermoelectric coolers) satisfactory for use with the present invention, are available from Marlow Industries, Inc., located in Dallas, Tex. U.S. Pat. No. 4,855,810, entitled Thermoelectric Heat Pump, and U.S. Pat. No. 5,064,476, entitled Thermoelectric Cooler and Fabrication Method, show various details associated with fabrication of thermoelectric devices satisfactory for use with the present invention.

Thermoelectric elements 32 are preferably coupled electrically in series and thermally in parallel by conductive plates 34 and 36. Thermoelectric device 30 also includes couplings to a DC power supply (not explicitly shown) by way of positive DC connection 38 and negative DC connection 40. The power supply (not shown) can be a battery, DC power generator, AC/DC convertor, or any other appropriate source of DC electricity. When DC electricity with the appropriate polarity is supplied to thermoelectric device 30, heat is absorbed on the cold side represented by first conductive plate 34. The heat passes through thermoelectric elements 32 and is dissipated on the hot side represented by second conductive plate 36. Electrical connections 38 and 40 are typically attached to second conductive plate or hot plate 36 to eliminate the need to transfer any thermal energy or heat associated with electrical connections 38 and 40 from cold plate 34 through thermal electric elements 32 to hot plate 36.

Thermoelectric heat transfer system 31 as shown in FIG. 2 includes thermoelectric device 30 and heat exchanger 50 incorporating various teachings of the present invention. The efficiency of thermoelectric device 30 is enhanced by mounting heat exchanger 50 on second conductive plate or hot plate 36. Various methods may be used to mount heat exchanger 50 on second conductive plate 36, including adhesive bonding, compression using thermal grease, and/or soldering.

For the embodiment shown in FIGS. 2 and 3, heat exchanger 50 includes first chamber or boiling section 60 and second chamber or condensing section 80. Depending upon the type of working fluid contained within heat exchanger 50, first chamber 60 may also be described as an evaporating or vaporizing section.

Depending upon the application for thermoelectric heat transfer system 31 and the desired operating temperature range for thermoelectric device 30, various types of working fluids, which are preferably environmentally friendly, may be placed within heat exchanger 50. For one embodiment of the present invention, the working fluid may be R134A, a refrigerant commonly known in the art. Another acceptable working fluid is hydroflouroether ($C_4F_9OCH_3$). Hydroflouroether is compatible with aluminum, which may be used to form boiling section 60. Also, since hydroflouroether has minimal effects on the atmosphere and the environment, it may have a strong future of widespread use within the refrigeration industry. Working fluids which experience change between a liquid phase and a vapor phase within the desired operating temperature and pressure range for thermoelectric heat transfer system 31 are particularly beneficial due to the latent heat of vaporization typically required to make such phase changes.

Examples of other working fluids satisfactory for use with thermoelectric heat transfer system 31, include water, alcohol and refrigerants having desired heat transfer characteristics. Water is often preferred since it is generally environmentally friendly and has no ozone effect. Methanol is an example of one alcohol satisfactory for use with the present invention. Examples of refrigerants satisfactory for use with the present invention include ammonia, ethyl chloride, methyl chloride, sulphur dioxide, fluorocarbons, hydrocarbons, hydrofluorocarbons (HFC) and halogenated hydrocarbons other than chlorofluorocarbons (CFC) which have been generally banned. For some applications, it may be preferable to include a non-CFC refrigerant. The present invention allows the use of many different working fluids including non-CFC refrigerants. Various glycol compounds may also be used as the working fluid.

The term "boiling" is used to describe vigorous, turbulent creation of vapor bubbles from a working fluid in its liquid phase when the temperature of the working fluid adjacent to a heat transfer surface has been increased to the respective boiling temperature. Heat transfer coefficients associated with boiling liquids are generally much higher than heat transfer coefficients associated with natural or forced air convection and natural or forced liquid convection. As a result, heat transfer rates associated with boiling liquids are generally much higher than heat transfer rates for the same liquids prior to boiling.

For some applications, heat exchanger 50 may contain a working fluid which is evaporated or vaporized within first chamber 60 without boiling. For such applications boiling section 60 may be referred to as an evaporating section or a vaporizing section. Heat exchanger 50 may also be described as a "reboiler" or a "thermosiphon reboiler." One of the benefits of the present invention includes the ability to select the type of working fluid and the heat transfer mechanism (boiling, vaporization, and/or evaporation) which optimizes both heat transfer and overall thermal efficiency of the respective thermoelectric device 30. For most working fluids the boiling temperature will vary in response to the pressure within heat exchanger 50.

As will be explained later in more detail, first chamber 60 preferably includes a boiling surface and second chamber 80 preferably includes a condensing surface located remote from the boiling surface. First chamber 60 and second chamber 80 are preferably sealed to prevent undesired escape of working fluid from heat exchanger 50. Condensing chamber 80 is preferably disposed at an elevated position relative to boiling chamber 60 such that working fluid which has been heated in boiling chamber 60 to its vapor phase can flow upwardly into condensing chamber 80 and working fluid which has been condensed into its liquid phase in the condensing chamber 80 and flow downwardly into boiling chamber 60.

A wide variety of alternative fluid flow paths may be formed between the boiling section or chamber and the condensing section or chamber of a heat exchanger in accordance with the teachings of the present invention. A fluid flow path defined in part by hollow tube 52 is provided between boiling section or chamber 60 and condensing section or chamber 80. For the embodiment of the present invention represented by heat exchanger 50, working fluid in the liquid state will flow downwardly from condensing section 80 through hollow tube 52 into boiling section 60. Working fluid in the form of vapor and/or gas will flow upwardly from boiling section 60 through hollow tube 52 into condensing tubes 88. For one application, hollow tube 52 has an inside diameter of approximately five eighths of an inch and an outside diameter of approximately 0.8 inches. For the same application the length of hollow tube 52 is approximately four and one half inches.

The geometric configuration and dimensions associated with first chamber 60 and second chamber 80 may be varied substantially in accordance with the teachings of the present invention to optimize the performance of thermoelectric device 30. For some applications, the fluid flow path may be formed from various types of flexible material which allow varying the location of condensing section 80 relative to boiling section 60 depending upon the specific use of thermoelectric heat transfer system 31.

As shown in FIGS. 2 and 3, in one embodiment of the present invention, condensing section 80 is located directly above boiling section 60 of the heat exchanger to take advantage of gravitational forces which allow vaporized working fluid to flow generally upward from the boiling surface to the condensing surface and condensed working fluid in the form of a liquid to flow generally downward from the condensing surface to the boiling surface. In alternative embodiments, hollow tube 52 may extend upwardly at an angle relative to boiling section 60. As a result, condensing section 80 may be located above and offset from boiling section 60. One of the benefits resulting from the present invention includes the ability to vary the orientation of hollow tube 52 with respect to boiling section 60 and condensing section 80 to optimize the performance of the resulting thermoelectric heat transfer system.

Various heat loads may be mounted on or attached to first conductive plate or cold plate 34 of thermoelectric device 30. As shown in FIGS. 2, 3 and 4, thermoelectric heat transfer system 31 includes heat sink 42 attached to and thermally coupled with first conductive plate 34. Heat sink 42 includes a plurality of fins 44 extending therefrom for use in transferring thermal energy from the surrounding environment to first conductive plate 34. The total surface area of heat sink 42 is preferably substantially larger than the surface area of first conductive plate 34. The number and size of fins 44 may be varied to obtain the desired heat transfer capability with respect to first conductive plate 34.

As illustrated in FIG. 2, fan 48 may be provided adjacent to heat sink 42 to increase the flow of air with respect to fins 44. Fan 48 may be selected from many commercially available models. One or more fans may also be incorporated into other embodiments of the present invention, as discussed later in more detail. FIG. 3 illustrates an alternative placement of fan 48 with respect to heat sink 42.

Thermoelectric heat transfer system 31 preferably includes thermoelectric device 30 with heat exchanger 50 mounted on one side and heat sink 42 mounted on the opposite side. In an alternative embodiment, as illustrated in FIG. 4, another heat exchanger 250 filled with a suitable working fluid may be attached to first conductive plate 34. For purposes of illustration, heat exchanger 250 is shown as having approximately the same configuration as heat exchanger 50. However, the functions associated with first chamber 260 and second chamber 280 would be substantially reversed as compared with the functions of first chamber 60 and second chamber 80. Depending upon the respective environment surrounding second chambers 80 and 280, heat exchangers 50 and 250 may be filled with the same working fluid or filled with substantially different working fluids. For some applications second chamber 280 would be used to boil or evaporate working fluid and first chamber 260 would be used to condense the working fluid. Various types of heat sinks and/or heat exchangers may be thermally coupled with first conductive plate 34 within the teachings of the present invention.

In another alternative embodiment, a thermoelectric heat transfer system similar to thermoelectric heat transfer system 31 may be provided with an electronic component (not expressly shown) thermally coupled with cold plate or first conductive plate 34 rather than heat sink 42. The electronic component may be a central processing unit (CPU) of a microprocessor, a field effect transistor, or any other electronic component or electrical circuit which requires temperature control for satisfactory operation.

For the embodiment of the present invention shown in FIGS. 2–5 and 8, boiling section 60 includes cover 62 attached to plate 64. The configuration of cover 62 may be selected in accordance with teachings of the present invention to optimize performance of the associated thermoelectric heat transfer system for use with a thermoelectric refrigerator or other type of enclosed structure with thermally conductive plates 34 and 36 extending approximately vertical relative to the associated enclosed structure.

As illustrated in FIG. 7, the portion of plate 64 disposed within cover 62 is designated as boiling surface 66. For some applications, an enhanced heat transfer surface such as shown in U.S. Pat. No. 3,990,862, entitled "Liquid Heat Exchanger Interface and Method," or other suitable enhanced heat transfer surface, is preferably formed as part of boiling surface 66 of plate 64. For one application, boiling surface 66 preferably has a porous metal coating with a thickness of approximately 0.2 to 2.0 milliliters and a void fraction of approximately 40% to 70%. The porous metal coating may be formed on plate 64 by thermal spray, sintered particles or other suitable techniques to provide boiling surface 66.

Sealing surfaces or flange surfaces 68 are formed around the perimeter of boiling surface 66. Sealing surfaces (not explicitly shown) are provided on the perimeter of cover 62 to form a fluid tight barrier with plate 64. The portion of plate 64 opposite from boiling surface 66 is thermally coupled with hot plate or second conductive plate 36 of thermoelectric device 30. As shown in FIG. 5, an elongated tube 78 may be provided at port 76 (see FIG. 8) to allow for filling or draining of working fluid from boiling section 60.

The configuration or shape of boiling section 60, as illustrated in FIGS. 2–5 and 8, is preferably selected in accordance with the teachings of the present invention to limit the total volume of boiling section 60 which minimizes the amount of working fluid contained therein, while at the same time, maximizing contact of working fluid in its liquid phase with boiling surface 66. Boiling section 60 is formed with at least two portions to ensure that working fluid in its liquid phase maintains significant contact with boiling surface 66. Upper portion 71 of boiling section 60 where opening 74 occurs for attachment of hollow tube 52, is the widest portion of boiling section 60, to accommodate opening 74. In this manner, the entire perimeter of opening 74 lies within approximately the same plane to accommodate hollow tube 52. By maintaining a thinner profile in lower portion 72 of boiling section 60, more working fluid in its liquid phase will contact boiling surface 66. This allows for an increased boiling rate to occur within boiling section 60.

Also, upper portion 71 of boiling section 60 is provided with a wider profile to accommodate vigorous boiling of the working fluid from boiling surface 66. Since the vapors will naturally rise, there will be more vapor in the upper portion 71 than in the lower portion 72. The wide profile allows the vapor to be collected and transferred to hollow tube 52 while maintaining liquid phase contact with boiling surface 66. For some applications, a pressure relief valve (not shown) may also be provided in boiling section 60. Depending upon the desired heat transfer rate and the configuration of the associated enclosed structure, boiling section or evaporating section 60 may have a wide variety of configurations which will provide a first portion or an upper portion with a relatively large volume to accommodate a mixture of working fluid in its vapor phase and its liquid phase and a second portion or lower portion with a relatively small volume to increase contact of the working fluid in its liquid phase with the associated boiling surface or evaporating surface.

For some applications, the dimensions of plate 64 may be selected to correspond with the dimensions of hot plate 36. For other applications, as shown in FIG. 2, plate 64 may be substantially larger than hot plate 36. The present invention allows varying the configuration and area of boiling surface 66 to reduce the differential temperature between boiling surface 66 and the associated thermoelectric elements to improve the efficiency of the associated thermoelectric device. Various techniques including soldering, brazing, welding, and/or adhesives may be used to attach cover 62 with plate 64.

As previously noted, various types of working fluid may be placed within heat exchanger 50 to increase the heat transfer capability of thermoelectric device 30. Also, various types of material such as aluminum, copper, silver and alloys of these metals along with various ceramics and/or cermets may be satisfactorily used to form the various components associated with heat exchanger 50. The type of material selected will depend upon the working fluid contained within heat exchanger 50, the amount of thermal energy transferred by thermoelectric device 30 and other desired operating characteristics along with manufacturing costs. For example, for many applications, water will be the preferred working fluid since it is generally environmentally friendly. Various copper alloys and aluminum alloys have the desired metallurgical characteristics, including strength and heat transfer coefficients satisfactory for use in fabricating heat exchanger 50. However, some aluminum alloys may experience corrosion problems when water is selected as the working fluid. Therefore, copper and/or copper alloys will often be used to fabricate heat exchanger 50 when water is selected as the working fluid.

One end of hollow tube 52 is attached to opening 74 in cover 62. As shown in FIGS. 2–5, condensing section 80 includes distribution header or manifold 82 with opening 84 formed therein. Opening 84 is sized to receive the other end of hollow tube 52. A plurality of slots (not explicitly shown) may be formed in header 82 for use in mounting hollow condensing tubes 88 thereto. Condensing section 80 also includes second distribution header or manifold 92 with a plurality of slots (not explicitly shown) formed therein to receive the other end of each condensing tube 88 opposite from first header 82.

Second header 92 is preferably disposed at an elevation above first header 82. For the embodiment shown in FIGS. 2–5, hollow condensing tubes 88 are disposed parallel with each other and perpendicular to first header 82 and second header 92. For some applications, second header 92 may be oriented at an angle varying from perpendicular as shown in FIG. 2 to approximately forty-five degrees (45°) (not shown). Since second header 92 is preferably disposed at an elevation above first header 82, gravity will act upon any condensate or liquid formed within condensing tubes 88 and cause the condensate to drain into first header 82.

As shown in FIGS. 2–5, heat exchanger 50 also includes convection cooler 140 having a plurality of fins 142 disposed between and thermally engaged with adjacent condensing tubes 88. Convection cooler 140 is used to dissipate thermal energy from the respective condensing tubes 88 to the surrounding environment. For the embodiment shown in FIGS. 2–5, heat energy is dissipated by airflow over the respective fins 142. For some applications, a liquid cooling stream (not shown) may be used to remove heat energy from condensing tubes 88 instead of an air cooling stream.

Figure 6A:
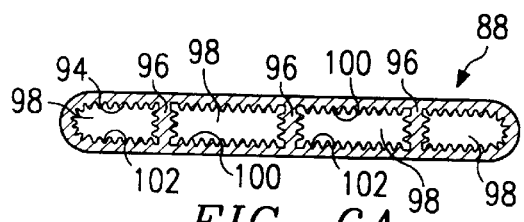
FIG. 6A is a schematic drawing in section taken along lines 6A—6A of FIG. 5 showing enhanced heat transfer surfaces contained within one of the condensing tubes.
Figure 6B:
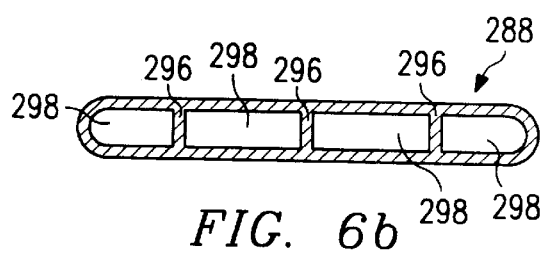
FIG. 6B is a schematic drawing in section of another embodiment of the enhanced heat transfer surface of FIG. 6A.

As shown in FIGS. 6A & 6B, each condensing tube 88 may include partitions 96 which divide the interior of each tube 88 into multiple flow channels 98. Partitions 96 provide required structural strength for respective tubes 88 and also increase the total surface area contained within each condensing tube 88. Partitions 96 and the resulting flow channels 98 extend longitudinally from first header 82 to second header 92. Enhanced heat transfer surfaces 94 are preferably formed on the interior surface of each flow channel 98.

Enhanced heat transfer surfaces 94 include a plurality of tips 100 alternating with flutes 102. Tips 100 and flutes 102 extend longitudinally within flow channels 98 of condensing tubes 88 between first header 82 and second header 92. Tips 100 and flutes 102 cooperate with each other to cause surface tension drainage of condensate from the extreme convex end of each tip 100 into the associated concave channels of the respective flutes 102. Gravity forces acting on condensate (not shown) contained within flutes 102 cause the condensate to flow in a generally downward direction through the respective flute 102 into first header 82. Evaporated or vaporized working fluid will flow upwardly through the respective flow channels 88 adjacent to and contacting tips 100.

The condensed working fluid will ultimately flow from first header 82 through fluid flow path 52 and return to evaporating section 60 to repeat the boiling cycle and associated heat transfer from thermoelectric device 30 to the ambient environment surrounding convection cooler 140.

The height of each tip 100 measured from its respective flute 102 and the width between adjacent tips 100 is selected to form a layer of condensate (not shown) within each flute 102. The depth or thickness of the condensate is preferably less than the height for the associated tip 100. If tips 100 are completely covered with a layer of condensate, the condensate will restrict heat transfer through the walls of hollow tubes 88 and the respective tips 100. Thus, condensate would act as a thermal barrier or insulator reducing the thermal efficiency of condensing section 80.

Based on the fluid flow characteristics of the working fluid and particularly the surface tension of the working fluid as condensed on enhanced heat transfer surfaces 94, the length of hollow tubes 88, the height of tips 100 and the width between adjacent tips 100 may be varied to ensure that at least a portion of the exterior surface of each tip 100 is exposed to vapors contained within the respective flow channels 98. Thus, the ability of enhanced heat transfer surfaces 94 to condense working fluid in the vapor or gas phase is substantially increased. If tips 100 are completely covered with a layer of condensate, the heat transfer through the associated tips 100 would be reduced and the capacity to condense vapors contained within the respective flow channel 98 would also be reduced.

The height of tips 100 and the width between adjacent tips 100 is selected in part based on the surface tension of the condensed working fluid contained with heat exchanger 50. For one application tips 100 have a height in the range of approximately 0.025 to 0.070 inches with a spacing in the range of approximately fifteen to forty tips per inch. Tips 100 may have a convex, trapezoid and/or sawtooth profile as desired. Enhanced heat transfer surfaces 94 of condensing tubes 88 cooperate with each other to provide a second condensing surface remotely located from the first condensing surface of boiling section 60. In an alternative embodiment as illustrated in FIG. 6B, condensing tubes 288 may be provided without tips and flutes. For this application, the interior of condensing tube 288 and partitions 296, which make up flow channels 298, are generally smooth and flat.

FIGS. 9A and 9B illustrate an alternative embodiment of the present invention represented by condensing section 180. Condensing section 180 may be provided as a single integrated component. Headers 182 and 192 provide similar functions as first header 82 and second header 92, respectively. Condensing tubes 188 provide conduits for the transfer of working fluid, in either a vapor or liquid form, between header 182 and header 192. Generally, circular opening 184 is provided for connection to hollow tube 52. The balance of the surface area of condensing section 180 provides for contact with ambient air and allows heat from working fluid contained within condensing section 180 to be transferred to the environment. All other functions of condensing section 180 are similar to those of condensing section 80.

In yet another embodiment of the present invention, all components of heat exchanger 50 could be fabricated as a single integrated component. This would provide many benefits, including ease of fabrication and installation. Extruded aluminum is an example of a material which could be utilized for this application. For other applications, all components of heat exchanger 50 could be injection molded utilizing polyethylene or a similar material. For this type of application, portions of the heat exchanger, including the condenser, could also include aluminum or copper as appropriate.

Various types of materials including metals, ceramics and/or composite materials may be used to form the components of the heat exchanger, including boiling section 60 and condensing section 80. For some applications, these materials and their method of assembly are selected to withstand an internal pressure of approximately fifty (50) psi. For other applications, the internal working pressure may be five hundred (500) psi or greater.

The internal working pressure contained within heat exchanger 50 will vary depending upon the type of working fluid contained therein, the amount of heat transferred by thermoelectric elements 32, thermal efficiency of boiling surface 66, condensing tubes 88 and convection cooler 140 and ambient temperature associated with air flow through convection cooler 140. For most applications the internal working pressure contained within heat exchanger 50 will be greater than atmospheric pressure. A temperature gradient is normally formed within heat exchanger 50 with boiling surface 66 having the highest temperature and condensing tubes 88 having the lowest temperature. The temperature difference between boiling surface 66 and condensing tubes 88 may establish a pressure difference to assist vapor flow from boiling section 60 to condensing section 80.

Various types of heat exchangers incorporating the teachings of the present invention may be thermally coupled with second conductive plate 36. The present invention is not limited to only one type of heat exchanger. Other types of heat exchangers may be used as long as they provide at least one sealed chamber to perform functions similar to boiling section 60 and condensing section 80.

By optimizing the configuration of the respective heat transfer surfaces including providing enhanced heat transfer surfaces as desired, working fluid disposed within heat exchanger 50 will boil with very little, if any, superheating of the bulk liquid, and the temperature difference across thermoelectric elements 32 and first conductive plate 36 will be substantially minimized. For some applications, depending upon the type of working fluid and the operating temperature of the associated thermoelectric device, heat exchanger 50 will function satisfactorily without the use of any enhanced heat transfer surfaces.

Figure 10:
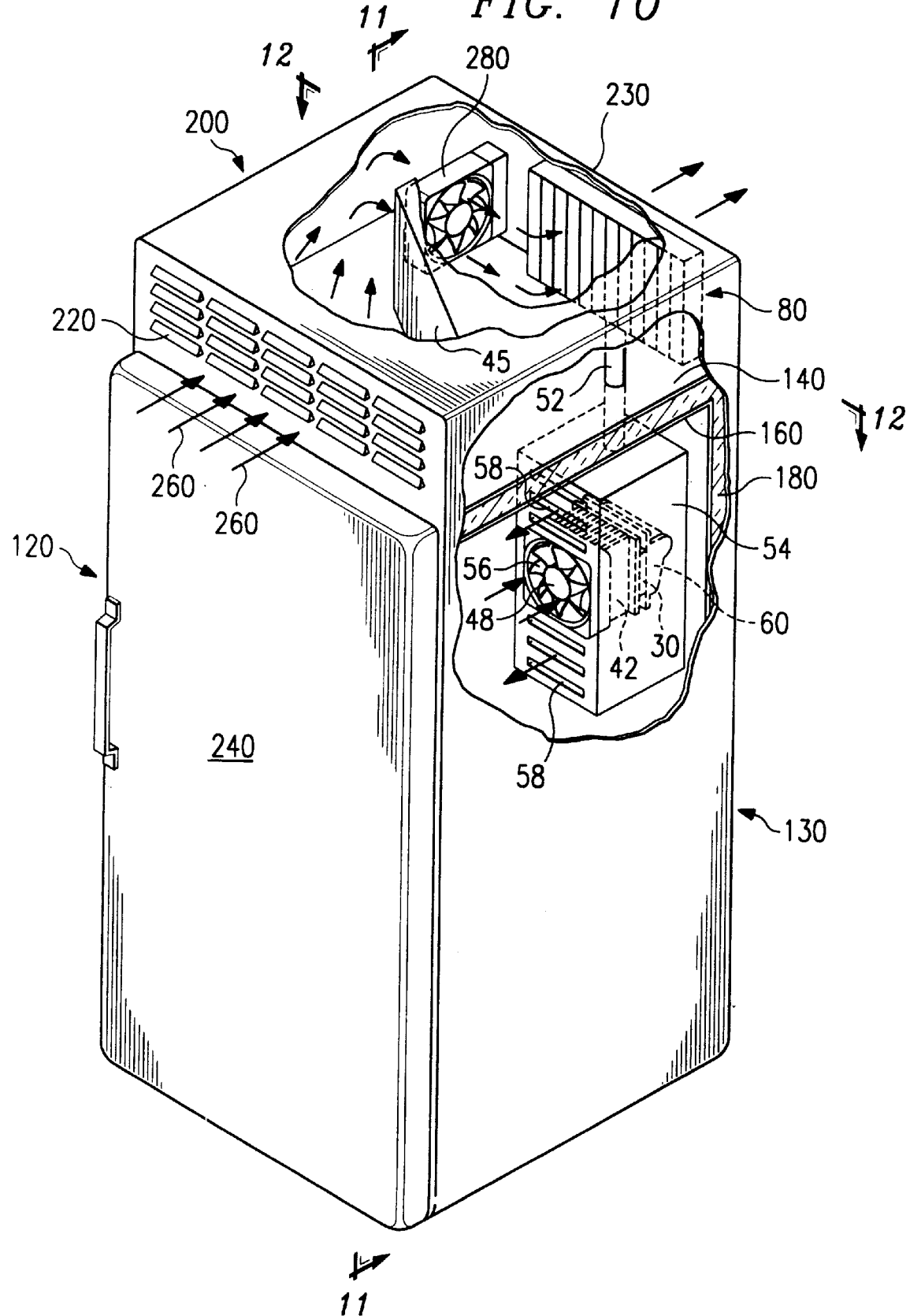
FIG. 10 is a schematic drawing, with portions broken away, showing an isometric view of a thermoelectric refrigerator having a heat transfer system with a thermoelectric device and heat exchanger incorporating one embodiment of the present invention.
Figure 11:
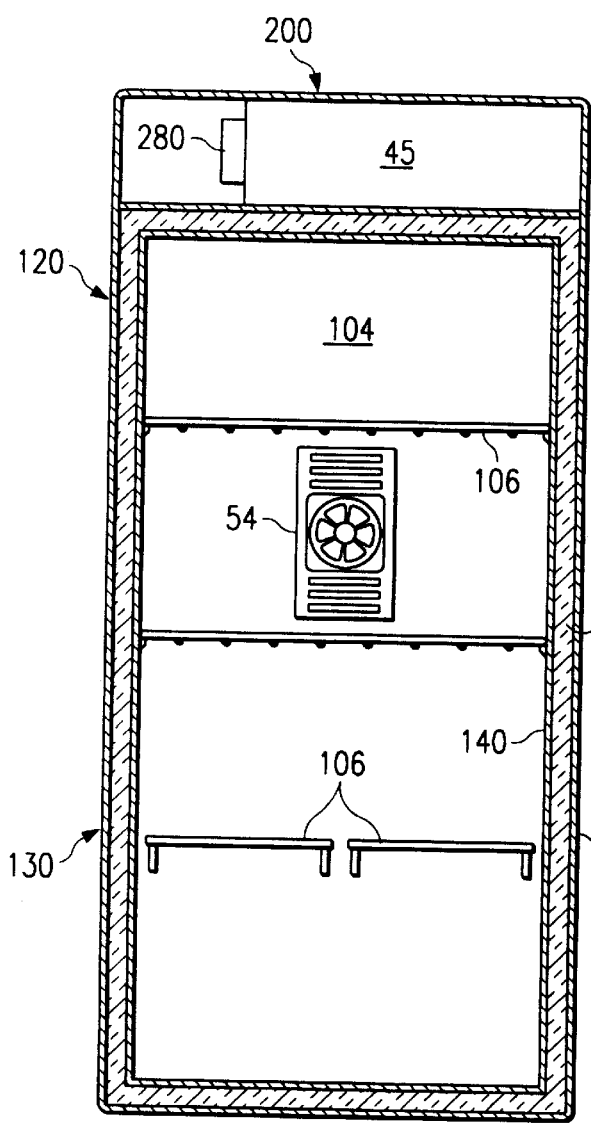
FIG. 11 is a drawing in section with portions broken away taken along line 11—11 of FIG. 10 showing one example of the interior configuration of a thermoelectric refrigerator incorporating teachings of the present invention.

Thermoelectric refrigerator 120 is shown in FIGS. 10 and 11 having thermoelectric heat transfer system 31 with thermoelectric device 30 and heat exchanger 50, formed in accordance with teachings of the present invention. Thermoelectric refrigerator 120 further includes enclosed structure 130 formed by three sidewalls, a top and a bottom. Door 240 is preferably mounted on enclosed structure 130 to control access to the interior of enclosed structure 130 through the opening. The sidewalls, the top and bottom of enclosed structure 130 preferably include inner liner 140 and outer liner 160. A layer of insulation 180 is preferably provided between inner liner 140 and outer liner 160.

In one embodiment of the present invention, the insulation 180 is continuous, standard injected foam, which is common to the art. In another embodiment of the present invention, the layer of insulation may include super insulation materials. Super insulation could be installed as a continuous process where the top, bottom and sides are all formed at once. As an alternative, vacuum panels could be provided. Vacuum panels appropriate for this application are shown in U.S. Pat. No. 5,090,981 entitled Method for Making High R Superinsulation Panel and U.S. Pat. No. 5,094,899 entitled High R Superinsulation Panel. A preferred superinsulation is described in U.S. Pat. No. 5,330, 816, entitled High R Super Insulation Panel. Vacuum panels provide significant insulating capacity and also provide structural and mechanical support to inner liner 140 and outer liner 160.

A plurality of storage shelves 106 may be located within the interior of enclosed structure 130 as represented by storage areas 104. Food products or other items which must be stored within a given temperature range may be placed upon shelves 106 or at any other location within the interior of enclosed structure 130.

For some applications, air plenum 200 may be formed on top of enclosed structure 130 for use in supplying increased air flow to condensing section 80. Air intake louver 220 may be located in air plenum 200 above door 240. Air exhaust louver 230 may be provided in air plenum 200 opposite from intake louver 220. Ambient air 260 is drawn through louver 220 by fresh air fan 280. Air diverter 45 is provided inside of air plenum 200 to divert ambient air 260 through fan 280 and across condensing section 80 to dissipate heat from louvered fins 142 of convection cooler 140. Heated air is then forced out of air plenum 200, through exhaust louver 230 by fan 280.

For some applications, air intake louver 220 and air exhaust louver 230 are disposed opposite from each other as shown in FIG. 10. For other applications, the location of air intake louver 220 and/or air exhaust louver 230 may be varied depending on other equipment which may be located adjacent to thermoelectric refrigerator 220. Also, the location of air intake louver 220 and/or exhaust louver 230 may be varied depending upon the location in which the associated thermoelectric heat transfer system is installed within enclosed structure 130. As discussed later in more detail, FIGS. 12a, 12b and 12c show examples of alternative locations for installation of a thermoelectric heat transfer system incorporating teachings of the present invention.

In one embodiment of the present invention, thermoelectric heat transfer system 31 of FIG. 2 is provided at the side or backwall of thermoelectric refrigerator 120 opposite door 240. Thermoelectric heat transfer system 31 is contained within housing 54 to regulate airflow to and from heat sink 42 and to protect various components of thermoelectric heat transfer system 31 from possible damage. The profile of housing 54 and thermoelectric heat transfer system 31 and the configuration of the components of heat exchanger 50 allow the storage space within refrigerator 120 to be maximized. The configuration shown in FIGS. 10 and 11 also reduces the total volume of a thermoelectric refrigerator that must be dedicated to the associated cooling system. In another embodiment of the present invention, thermoelectric heat transfer system 31 may be mounted to door 240 to minimize the number of openings contained within enclosed structure 130 and therefore, maximize the insulation integrity.

Housing 54 further includes opening 56 at fan 48 to allow air from within refrigerator 120 to be drawn through fan 48 and across heat sink 42, reducing the temperature of the air. Air is then forced through louvers 58 of housing 54 and recirculated throughout the interior of enclosed structure 130. In alternative embodiments of the present invention, the orientation and location of thermoelectric heat transfer system 31 and housing 54 as well as the size, location and orientation of opening 56 and louvers 58 may be altered to achieve varying performance and air flow patterns, within the teachings of the present invention.

Figure 12A:
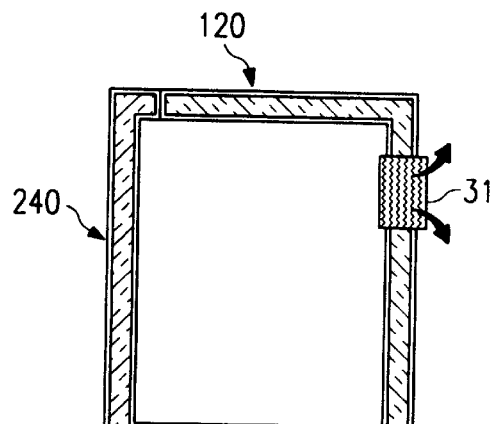
FIGS. 12A–12C are schematic drawings in section with portions broken away showing alternative locations for a thermoelectric heat transfer system in a thermoelectric refrigerator incorporating teachings of the present invention.
Figure 12B:
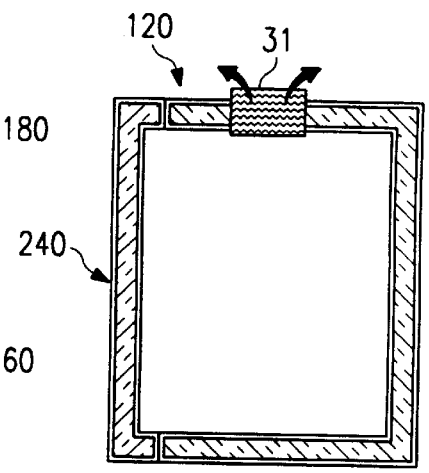
Figure 12C:
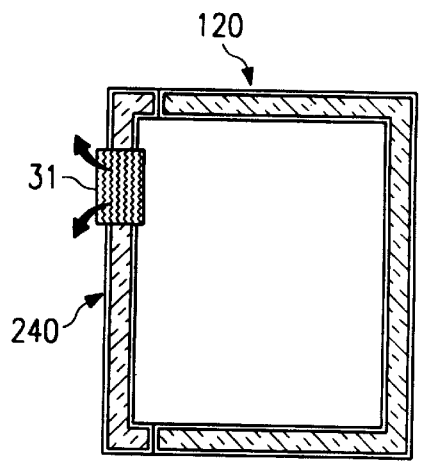

FIGS. 12A–12C illustrate alternative locations for thermoelectric heat transfer system 31, to accommodate the various airflow configurations available within the teachings of the present invention. The location of intake louver 220 and exhaust louver 230 can be modified as needed due to the location of refrigerator 120 with respect to the surrounding environment. As an example, intake louver 220 may be placed at the front (door-side) of refrigerator 120, near the top, as shown in FIG. 10. This provides enhanced airflow when refrigerator 120 is built into a wall or underneath millwork cabinetry. The location of air intake louver 220 and exhaust louver 230 can be modified to allow for intake and/or exhaust louvers to be located anywhere on refrigerator 120.

For some applications, the intake louver 220 and exhaust louver 230 could be provided on the same side of refrigerator 120 and the area occupied by air plenum 200 in FIG. 10 could be utilized as additional storage space. In the same manner, all other components of thermoelectric refrigerator 120 may be manipulated to allow for the preferred air flow configuration and to maximize storage space.

Fresh air fan 280 and fan 48 can be selected from a number of commercially available units. In one embodiment of the present invention, fans 280 and 48 are rotary impeller fans and provide a small, thin profile to minimize the amount of space required, while providing relatively significant air flow. In an alternative embodiment, one motor (not shown) could be provided to drive two impellers.

The size, location, configuration and type of components of thermoelectric heat transfer system 31 can also be modified as required to accommodate the temperature requirements of open storage space 104 and the environmental conditions surrounding refrigerator 120. As an example, in an alternative embodiment of the present invention, condensing section 80 can be provided as a large, thin unit with a surface area approximately equal to one side of refrigerator 120. This will allow for more contact with ambient air, and accommodate a more rapid transfer of heat from condensing section 80 to the surrounding environment. Other modifications include the material used to form any portion of thermoelectric heat transfer system 31, the type and location of fans 280 and 48, as well as the size and type of heat exchanger 50 and its components, and the size and type of thermoelectric device 31 and heat sink 42.

The various embodiments of a thermoelectric heat transfer system have been generally described in conjunction with cooling a load but can also be used for heating a load without departing from the inventive concepts of the present invention. The thermoelectric heat transfer system of the present invention provides technical advantages of increased efficiency and improved reliability over previously developed thermoelectric heat transfer systems.

Although the present invention and its advantages have been described in detail, it should be understood that various changes, substitutions, and alterations can be made without departing from the spirit and scope of the invention as defined by the appended claims.

What is claimed is:

1. A thermoelectric refrigerator having a thermoelectric heat transfer system to maintain temperature within an interior portion of the thermoelectric within a selected range, comprising:

a thermoelectric device with a plurality of thermoelectric elements for transferring thermal energy therethrough;

first and second thermally conductive plates having the thermoelectric elements disposed therebetween;

the first thermally conductive plate disposed within the interior portion of the thermoelectric refrigerator;

a heat exchanger containing a working fluid;

the heat exchanger having a first, sealed chamber with a first surface for evaporating the working fluid and a second, sealed chamber with a second surface for condensing the working fluid;

the second condensing surface located remote from the first evaporating surface;

the first evaporating surface of the heat exchanger thermally coupled with the second conductive plate of the thermoelectric device;

a fluid flow path extending between the first chamber and the second chamber;

the fluid flow path communicating the working fluid between the first chamber and the second chamber; and the working fluid cooperating with the thermoelectric elements to transfer heat energy from the first thermally conductive plate through the thermoelectric elements, the second thermally conductive plate, the first evaporating surface to the second condensing surface of the heat exchanger.

2. The thermoelectric refrigerator of claim 1 wherein the first, sealed chamber further comprises:

a first portion and a second portion;

the first portion having a generally reduced interior volume to minimize the amount of working fluid required to fill the first portion and to maximize contact between the working fluid in its liquid phase and the first evaporating surface;

the second portion coupled to and disposed above the first portion when the thermoelectric heat transfer system is installed at a selected location within the thermoelectric refrigerator; and the second portion sized larger than the first portion to accommodate collection of the working fluid in its vapor phase.

3. The thermoelectric refrigerator of claim 1 wherein the first evaporating surface further comprises an enhanced heat transfer surface to promote boiling of the working fluid by the first evaporating surface.

4. The thermoelectric refrigerator of claim 1 wherein the second condensing surface further comprises an enhanced heat transfer surface to improve thermal efficiency of the condensing surface.

5. The thermoelectric refrigerator of claim 1 wherein the second condensing surface further comprises an enhanced heat transfer surface having a plurality of alternating tips and flutes to improve thermal efficiency of the condensing surface.

6. The thermoelectric refrigerator of claim 1 further comprising a convection cooler disposed on the exterior of the heat exchanger adjacent to the second condensing surface.

7. The thermoelectric refrigerator of claim 1 further comprising:

a convection cooler disposed on the exterior of the heat exchanger adjacent to the second condensing surface; and a plurality of fins formed as part of the convection cooler.

8. The thermoelectric refrigerator of claim 1 further comprising the heat exchanger formed in part from material selected from the group consisting of aluminum, aluminum alloys, ceramics, cermets, composites, copper and copper alloys.

9. The thermoelectric refrigerator of claim 1 further comprising:

a heat sink thermally coupled with the first conductive plate of the thermoelectric device; and the thermoelectric refrigerator having a storage area from which the heat sink removes thermal energy.

10. The thermoelectric refrigerator of claim 1 wherein the working fluid comprises a hydroflourocarbon generally designated as R134A.

11. The thermoelectric refrigerator of claim 1 wherein the working fluid comprises hydrofluoroether having the general formula $C_4F_9OCH_3$.

12. The thermoelectric refrigerator of claim 1 wherein the working fluid comprises a refrigerant selected from the group consisting of ammonia, methanol, ethyl chloride, methyl chloride, sulphur dioxide, water, alcohol, fluorocarbons, hydrocarbons, halogenated hydrocarbons and hydrofluorocarbon (HFC) compounds.

13. The thermoelectric refrigerator of claim 1 wherein the working fluid comprises a non-CFC refrigerant.

14. The thermoelectric refrigerator of claim 1 further comprising a port for adding and removing the working fluid from the first chamber.

15. The thermoelectric refrigerator of claim 1 wherein the heat load comprises a heat sink thermally coupled with the first conductive plate and the heat sink disposed within the thermoelectric refrigerator.

16. A method for increasing the heat transfer efficiency of a thermoelectric refrigerator having thermoelectric heat transfer system including a thermoelectric device with a plurality of thermoelectric elements disposed between a first thermally conductive plate and a second thermally conductive plate with the thermoelectric elements electrically coupled in series with respect to each other and thermally coupled in parallel with respect to the first and second thermally conductive plates, comprising the steps of:

thermally coupling the first thermally conductive plate with a heat sink;

placing the heat sink within the thermoelectric refrigerator with the second chamber having a plurality of hollow tubes;

forming a heat exchanger having a first chamber and a second chamber;

forming a fluid flow path between the first chamber and the second chamber;

forming a first evaporating surface as a part of the first chamber and forming a second condensing surface as a part of the second chamber;

placing a working fluid within the heat exchanger and sealing the heat exchanger to prevent undesired escape of the working fluid;

thermally coupling the first evaporating surface with the second thermally conductive plate;

providing electrical power to the thermoelectric elements to transfer heat energy from the heat sink and the first thermally conductive plate to the second thermally conductive plate;

transferring heat energy from the second thermally conductive plate to the first evaporating surface to convert the working fluid from its liquid phase to its vapor phase;

communicating the working fluid in its vapor phase from the first chamber to the second chamber through the fluid flow path;

condensing the working fluid in its vapor phase on the second condensing surface in the second chamber; and returning the condensed working fluid to the first chamber through the fluid flow path.

17. The method of claim 16 wherein forming the second sealed chamber further comprises the steps of:

forming the plurality of hollow tubes with an enhanced heat transfer surface on the interior of each hollow tube;

coupling each hollow tube with a manifold to form a portion of the second sealed chamber; and attaching a plurality of convection cooling fins to the exterior of the hollow tubes whereby the fins transfer heat from the hollow tubes to the environment surrounding the second sealed chamber.

18. The method of claim 16 further wherein forming the first sealed chamber further comprises the steps of:

forming a first portion of the first sealed chamber with a relatively small fluid volume to increase contact between the working fluid in its liquid phase and the first evaporating surface; and forming a second portion of the first sealed chamber with a larger fluid volume to accomodate a mixture of working fluid in its liquid phase and vapor phase.

19. A thermoelectric refrigerator defined in part by an enclosed structure having five walls and an opening to an interior of the enclosed structure and a door assembly mounted on the opening for selectively controlling access to the interior of the enclosed structure and a thermoelectric heat transfer system comprising:

a thermoelectric device with first and second thermally conductive flat plates lying in generally parallel planes;

a heat exchanger with a first evaporating section and a second condensing section, the first evaporating section coupled to the second thermally conductive plate;

the second condensing section disposed above and connected to the first evaporating section by a fluid flow path extending therebetween;

the evaporating section further comprising a first portion and a second portion coupled together to form a fluid tight chamber;

the first portion having a reduced fluid volume with respect to the second portion;

the second portion coupled to and disposed above the first portion;

the second portion having a fluid volume sized larger than the first portion to accommodate communication of working fluid in its vapor phase with the fluid flow path; and a heat sink coupled to the first thermally conductive plate of the thermoelectric device.

20. The thermoelectric refrigerator of claim 19 wherein the thermoelectric heat transfer system further comprises means for circulating air within the interior of the enclosed structure over the heat sink.

21. The thermoelectric refrigerator of claim 20 further comprising:

the thermoelectric device mounted on one wall of the enclosed structure; and the condensing section of the heat exchanger disposed on the exterior of the enclosed structure above the thermoelectric device.

22. A thermoelectric refrigerator defined in part by an enclosed structure and a thermoelectric heat transfer system for controlling the temperature within the enclosed structure, comprising:

the enclosed structure having three side walls, a top, a bottom and an opening to the interior of the enclosed structure;

a door assembly mounted on the opening for controlling access to the interior of the enclosed structure;

an air plenum disposed on the top of the enclosed structure;

the thermoelectric heat transfer system mounted one of the side walls;

the thermoelectric heat transfer system further comprising a condensing section disposed within the air plenum;

a heat sink disposed within the interior of the enclosed structure;

a first air circulation fan disposed adjacent to the heat sink to circulate air within the interior of the enclosed structure past the heat sink;

the air plenum having an air intake louver and an air exhaust louver;

an air intake fan located inside the air plenum; and an air diverter to create an airflow path from the air intake louver, through the air intake fan, across the condensing section, and out of the air plenum through the exhaust louver.

* * * * *